(12) United States Patent
Yuan et al.

(10) Patent No.: US 8,966,412 B1
(45) Date of Patent: Feb. 24, 2015

(54) METHODS OF GENERATING CIRCUIT LAYOUTS THAT ARE TO BE MANUFACTURED USING SADP TECHNIQUES

(71) Applicant: GLOBALFOUNDRIES Inc., Grand Cayman (KY)

(72) Inventors: Lei Yuan, Cupertino, CA (US); Jongwook Kye, Pleasanton, CA (US); Harry J. Levinson, Saratoga, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/035,329

(22) Filed: Sep. 24, 2013

(51) Int. Cl.
  *G06F 17/50* (2006.01)
(52) U.S. Cl.
  CPC .................................. *G06F 17/5072* (2013.01)
  USPC .................................. 716/55; 716/50; 716/54
(58) Field of Classification Search
  USPC ............................................... 716/50, 54, 55
  See application file for complete search history.

(56) References Cited

U.S. PATENT DOCUMENTS

| | | | |
|---|---|---|---|
| 7,539,970 B2 | 5/2009 | Jung et al. | |
| 7,873,935 B2 | 1/2011 | Jung et al. | |
| 7,926,001 B2 * | 4/2011 | Pierrat | 716/50 |
| 7,927,928 B2 * | 4/2011 | Pierrat | 438/142 |
| 8,211,807 B2 | 7/2012 | Chen et al. | |
| 8,448,100 B1 | 5/2013 | Lin et al. | |
| 8,667,443 B2 * | 3/2014 | Smayling et al. | 716/119 |
| 2011/0014786 A1 | 1/2011 | Sezginer et al. | |
| 2013/0219347 A1 | 8/2013 | Zou et al. | |

FOREIGN PATENT DOCUMENTS

WO    2013/101108 A1    7/2013

* cited by examiner

*Primary Examiner* — Sun Lin
(74) *Attorney, Agent, or Firm* — Amerson Law Firm, PLLC (57) ABSTRACT

One method disclosed herein involves, among other things, identifying a plurality of features within an overall pattern layout that cannot be decomposed using the SADP process, wherein at least first and second adjacent features are required to be same-color features, decreasing a spacing between the first and second adjacent features such that the first feature and the second feature become different-color features so as to thereby render the plurality of features decomposable using the SADP process, decomposing the overall pattern layout into a mandrel mask pattern and a block mask pattern, and generating mask data sets corresponding to the mandrel mask pattern and the block mask pattern.

19 Claims, 10 Drawing Sheets

(Prior Art)

Figure 1M

(Prior Art)

Figure 2A

0 = Mandrel Metal (Color A)
1 = Non-Mandrel Metal (Color B)

METHODS OF GENERATING CIRCUIT LAYOUTS THAT ARE TO BE MANUFACTURED USING SADP TECHNIQUES

BACKGROUND OF THE INVENTION

1. Field of the Invention

Generally, the present disclosure relates to the manufacture of sophisticated semiconductor devices, and, more specifically, to various methods of generating circuit layouts that are to be formed using self-aligned double patterning (SADP) techniques.

2. Description of the Related Art

Photolithography is one of the basic processes used in manufacturing integrated circuit products. At a very high level, photolithography involves: (1) forming a layer of light or radiation-sensitive material, such as photoresist, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the original circuit design on the integrated circuit product. Historically, the feature sizes and pitches employed in integrated circuit products were such that a desired pattern could be formed using a single patterned photoresist masking layer. However, in recent years, device dimensions and pitches have been reduced to the point where existing photolithography tools, e.g., 193 nm wavelength photolithography tools, cannot form a single patterned mask layer with all of the features of the overall target pattern. Accordingly, device designers have resorted to techniques that involve performing multiple exposures to define a single target pattern in a layer of material. One such technique is generally referred to as multiple patterning, e.g., double patterning. In general, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features than would otherwise be impossible using existing photolithography tools.

The SADP process is one such multiple patterning technique. The SADP process may be an attractive solution for manufacturing next-generation devices, particularly metal routing lines on such next-generation devices, due to better overlay control that is possible when using an SADP process.

Figure 1A:
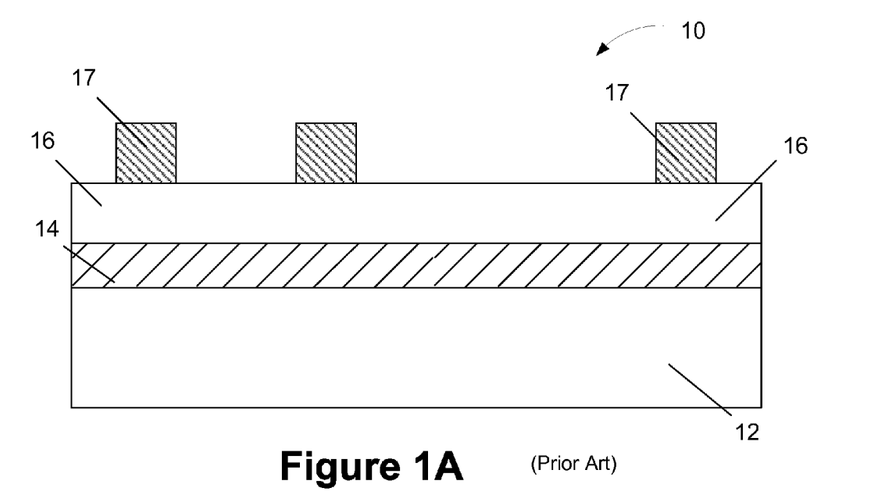
FIGS. 1A-1K depict one illustrative example of a prior art SADP process.

FIGS. 1A-1K depict one illustrative example of a device 10 wherein an illustrative prior art SADP process was performed to form metal features, e.g., metal lines, in a layer of insulating material 12. With reference to FIG. 1A, a hard mask layer 14 is formed above the layer of insulating material 12 and a layer of mandrel material 16 was formed above the hard mask layer 14. Also depicted is a patterned layer of photoresist material 17, typically referred to as a "mandrel mask," that was formed above the layer of mandrel material 16 using traditional, single exposure photolithography tools and techniques. The layer of mandrel material 16 may be comprised of a material that may be selectively etched with respect to the hard mask layer 14.

Figure 1B:
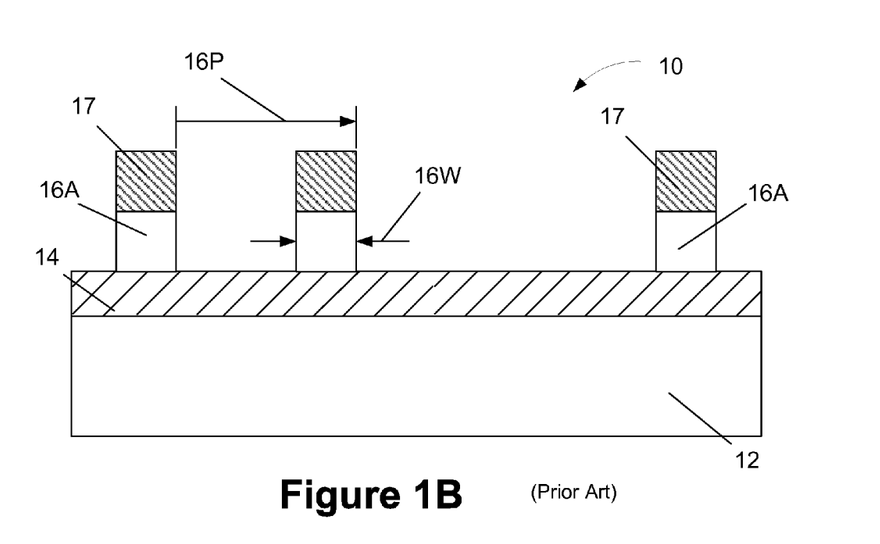
Figure 1C:
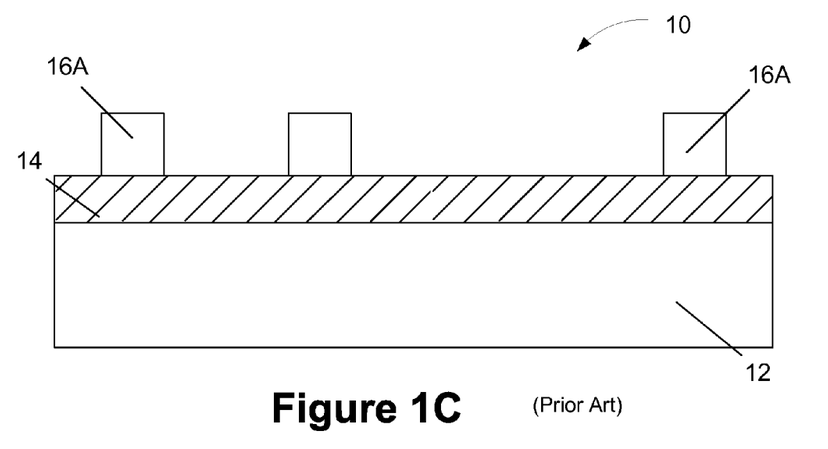

Next, as shown in FIG. 1B, an etching process is performed on the layer of mandrel material 16 while using the patterned layer of photoresist material 17 as an etch mask. This etching process results in the formation of a plurality of mandrels 16A. In the depicted example, the mandrels are formed so as to have a pitch 16P and a minimum width 16W. The pitch 16P and the width 16W may vary depending upon the particular device 10 under construction. FIG. 1C depicts the device 10 after the patterned layer of photoresist 17, i.e., the mandrel mask, has been removed.

Figure 1D:
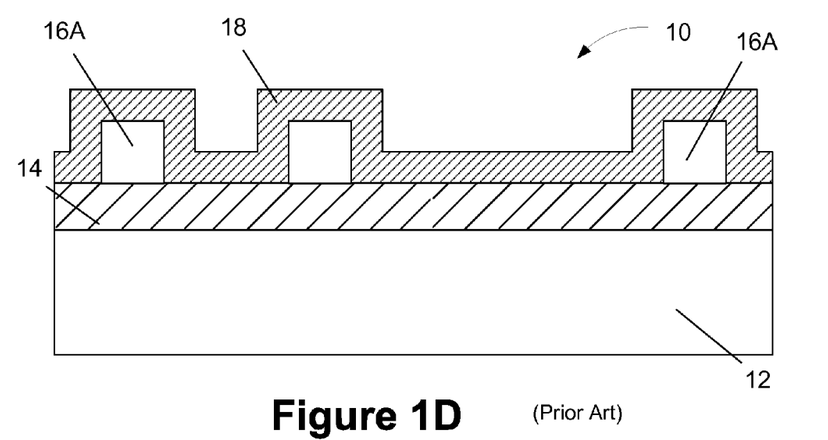
Figure 1E:
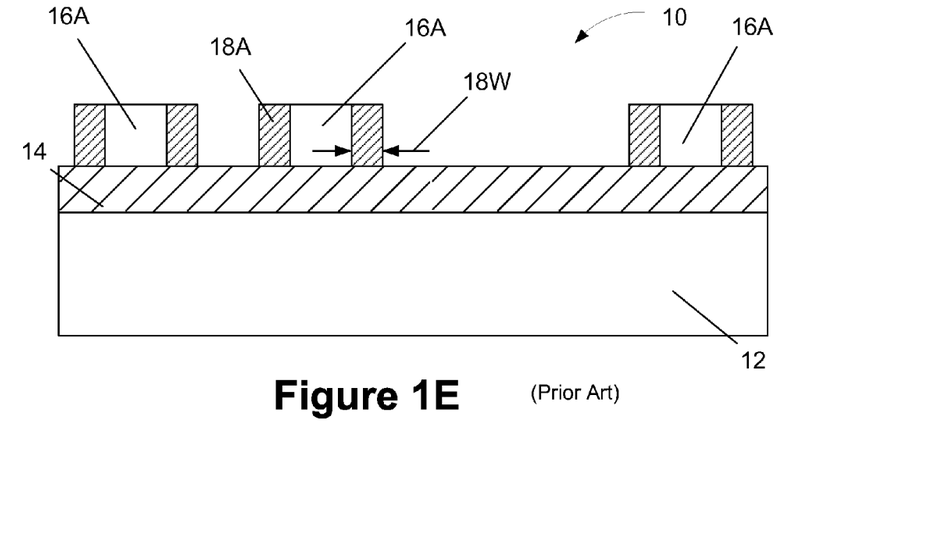
Figure 1F:
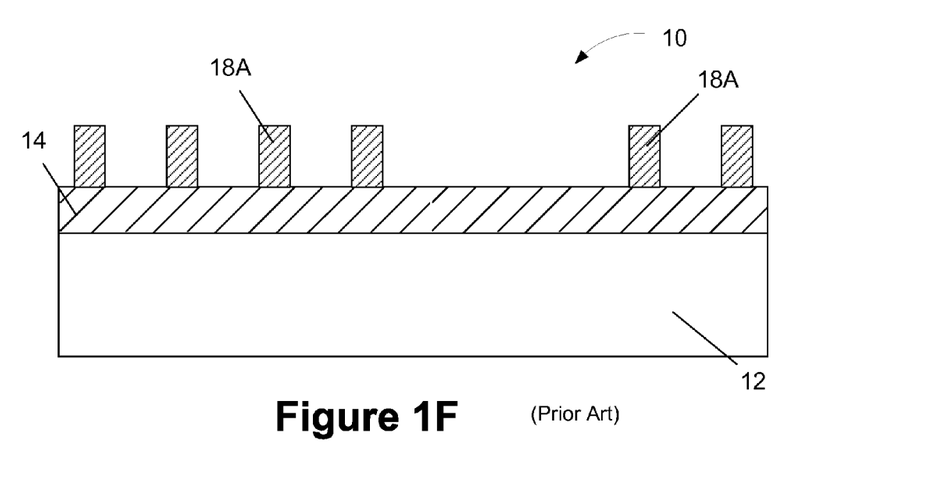

Next, as shown in FIG. 1D, a layer of spacer material 18 was deposited on and around the mandrels 16A by performing a conformal deposition process. The layer of spacer material 18 should be a material that may be selectively etched relative to the mandrels 16A and the hard mask layer 14. FIG. 1E depicts the device 10 after an anisotropic etching process was performed on the layer of spacer material 18 to define a plurality of sidewall spacers 18A, having a lateral width 18W, positioned adjacent the mandrels 16A. The width 18W of the spacers 18A may vary depending upon the particular device 10 under construction. Next, as shown in FIG. 1F, the mandrels 16A are removed by performing an etching process that is selective relative to the hard mask layer 14 and the sidewall spacers 18A.

Figure 1G:
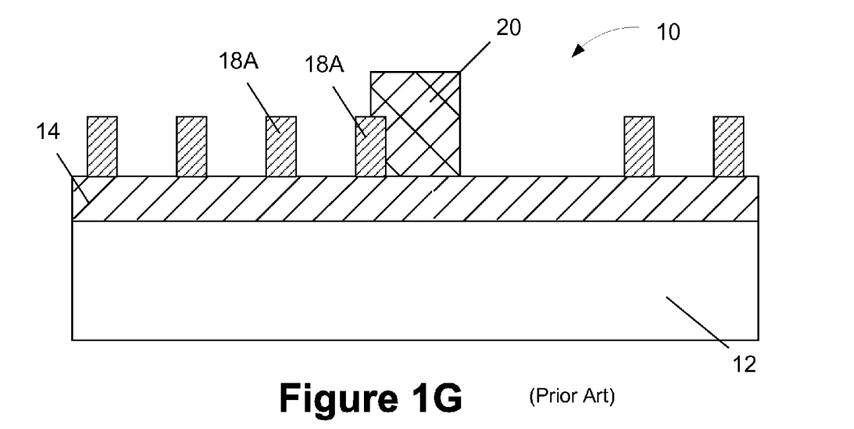
Figure 1H:
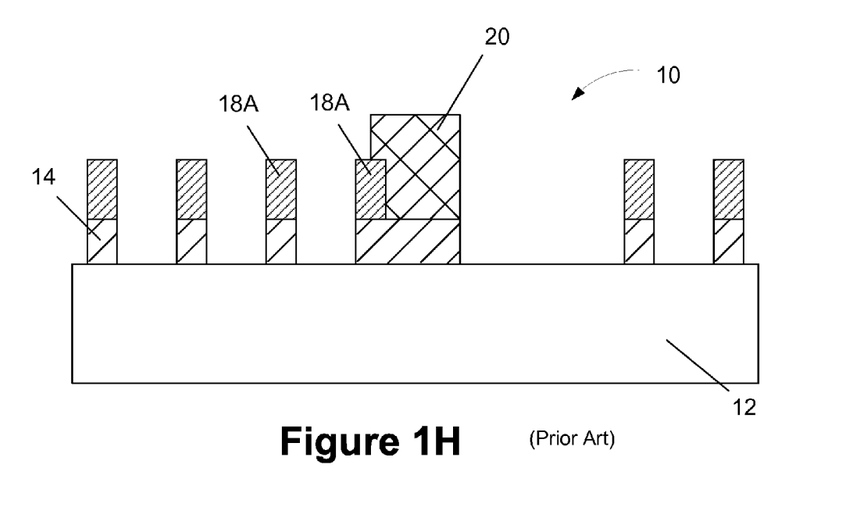
Figure 1I:
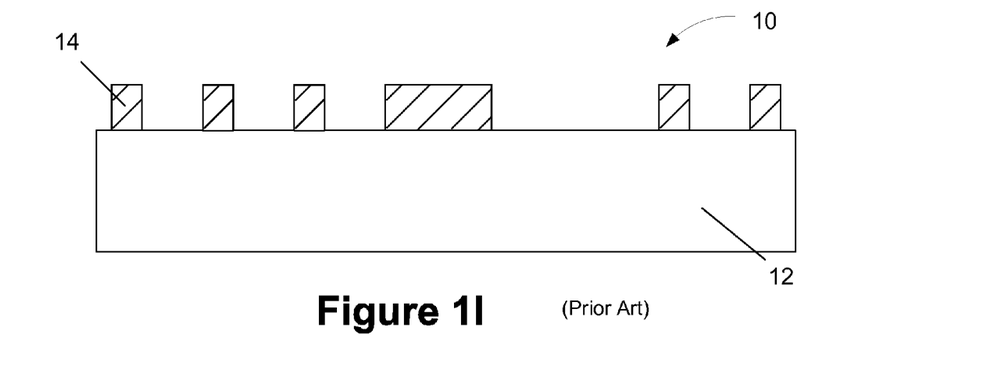
Figure 1J:
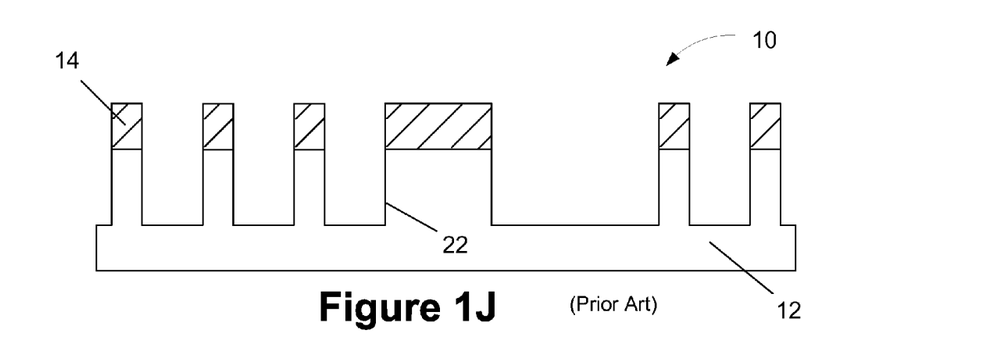
Figure 1K:
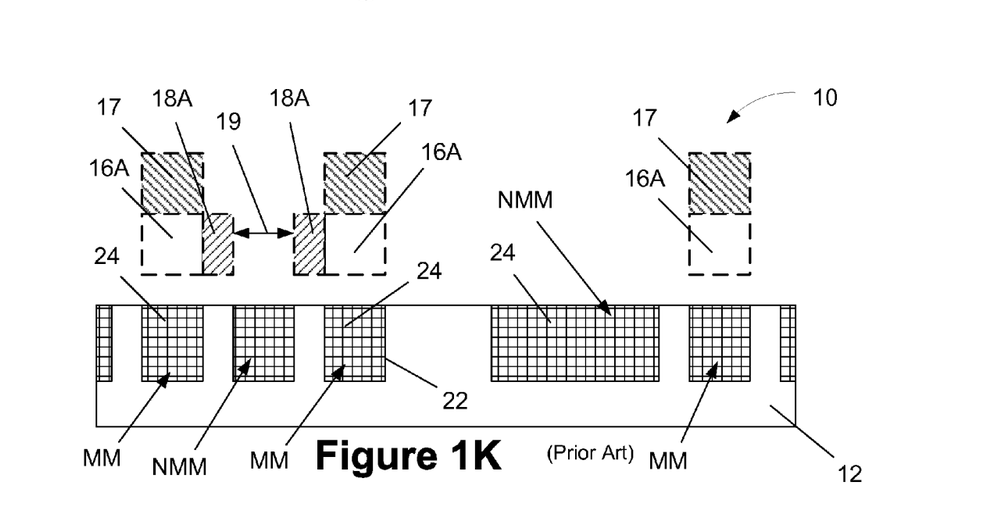

FIG. 1G depicts the device 10 after a patterned photoresist mask 20, a so-called block mask, is formed above the layer of spacers 18A and the hard mask layer 14. In one example, the block mask 20 may be formed using traditional, single exposure photolithography tools and techniques. FIG. 1H depicts the device 10 after an etching process has been performed to transfer the pattern defined by the combination (or union) of the sidewall spacers 18A and the block mask 20 to the hard mask layer 14. FIG. 1I depicts the device 10 after one or more process operations were performed to remove the sidewall spacers 18A and the block mask 20 from above the now-patterned hard mask layer 14. Next, as shown in FIG. 1J, an etching process was performed on the layer of insulating material 12 through the patterned hard mask 14 to define illustrative trenches 22 in the layer of insulating material 12. FIG. 1K depicts the device 10 after schematically depicted metal features 24, e.g., metal lines, were formed in the trenches 22 and after the patterned hard mask layer 14 was removed. The manner in which such metal features 24 may be formed in the layer of insulating material 12 are well known to those skilled in the art.

In the SADP process, the metal features 24 that are formed are typically referred to as either "mandrel-metal" features ("MM") or "non-mandrel-metal" features ("NMM"). As depicted in FIG. 1K, the metal features 24 that are positioned under the location where the mandrels 16A and the features of the mandrel mask 17 (both shown in dashed lines in FIG. 1K) were located, are so-called "mandrel-metal" features—designated as "MM" in FIG. 1K. All of the other metal features 24 formed in the layer of insulating material 12 are "non-mandrel-metal" features—designated as "NMM" in FIG. 1K. As it relates to terminology, the MM features and NMM features are referred to as being different "colors" when it comes to decomposing an overall pattern layout that is intended to be manufactured using an SADP process, as will be described more fully below. Thus, two MM features are said to be of the "same color" and two NMM features are said to be of the "same color, while an MM feature and an NMM feature are said to be of "different colors."

To use double patterning techniques, an overall pattern layout for a circuit must be what is referred to as double patterning compliant. In general, this means that an overall pattern layout can be decomposed into two separate patterns that each may be formed using existing photolithography tools and other techniques. An overall pattern layout may have many regions or areas that cannot be directly printed because the plurality of closely spaced features in those regions are spaced too close to one another for existing photolithography tools to be able to print such closely spaced features as individual features. To the extent a particular region under investigation has an even number of such features, such a pattern is sometimes referred to as an "even cycle" pattern, while a region that has an odd number of features is sometimes referred to as an "odd cycle" pattern. Even cycle patterns can be formed using double patterning techniques, while odd cycle patterns cannot be formed using double patterning techniques.

One well-known double patterning technique is referred to as LELE ("litho-etch-litho-etch) double patterning. As the name implies, the LELE process involves forming two photoresist etch masks and performing two etching processes to transfer the desired overall pattern to a hard mask layer that is then used as an etch mask to etch an underlying layer of material. With respect to terminology, the different masks employed in the LELE double patterning process are said to be different "colors." Thus, depending upon the spacing between adjacent features, the features may be formed using the same photoresist mask ("same color") or they may have to be formed using different photoresist masks ("different color"). In an LELE process, if two adjacent features are spaced apart by a distance that can be patterned using traditional single exposure photolithography, then those two adjacent features may be formed using the same ("same color") photoresist mask. In contrast, if the spacing between the two adjacent features is less than can be formed using single exposure photolithography, then those features must be either formed using different photoresist masks ("different color") or the spacing between the features must be increased by changing the circuit layout such that they may be formed using the same photoresist mask.

Figure 1L:
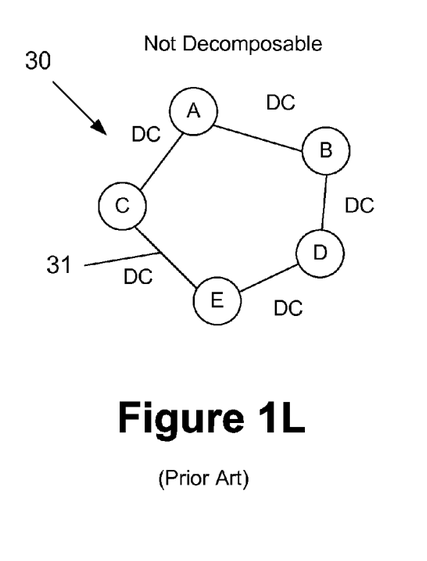
FIGS. 1L-1M depict illustrative examples of polygon loops and one example of resolving an odd-cycle conflict in a LELE process.
Figure 1M:
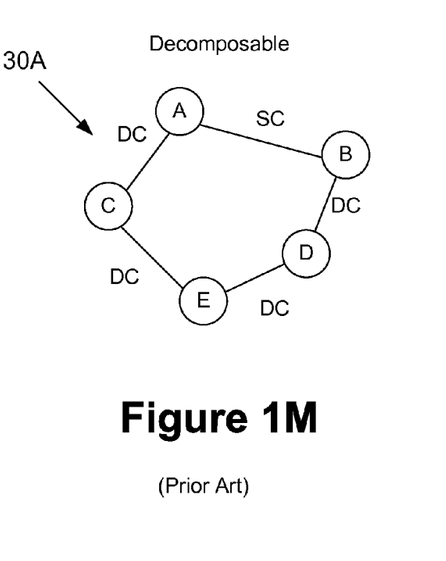

As noted above, any circuit layout to be formed using double patterning techniques must be checked to confirm that it can be decomposed into two separate photoresist masks. A layout must have zero odd-cycles to be decomposable in an LELE process. To determine if a circuit layout is double-patterning compliant, a mask engineer, using very sophisticated and well-known computer programs, connects adjacent features by "drawing" a "polygon loop" that connects the centroid of the features under investigation. FIG. 1L contains a simplistic example of such a polygon loop 30 drawn for five (A-E) adjacent features. The polygon loop 30 is comprised of five edges 31. In this example, due to the relative spacing between adjacent features, all of the features are required to be formed using "different color" ("DC") masks. Thus, the polygon loop 30 has five "DC" edges connecting the various features. The polygon loop 30 represents an odd-cycle layout due to the odd number of DC edges (five total) in the polygon loop 30. Due to the odd number of DC edges in the polygon loop 30, the pattern reflected by the polygon loop 30 is not decomposable using double patterning techniques. FIG. 1M depicts one illustrative modification that may be made to the circuit layout to make it decomposable. In this example, the spacing between the features A and B is increased such that those two features may be formed using the "same color" (SC) mask. Thus, the modified polygon loop 30A now has only four DC edges—an even number—and it may be decomposed using double patterning techniques. In short, in the LELE double patterning process, increasing the spacing between the adjacent features has the effect of "breaking" the odd-cycle polygon loop. However, increasing the spacing between adjacent features has the negative effect of increasing the area or "plot space" of silicon needed to fabricate the circuit, and increasing such spacing may have a "ripple" effect, causing additional odd-cycles that will need to be resolved.

In the SADP process, just like with the LELE process, a layout must have zero odd-cycles to be decomposable. However, unlike the LELE process, due to the nature of the SADP process, merely increasing the spacing between adjacent features within an odd-cycle polygon loop such that the two adjacent features must be formed using the "same color" mask will not resolve an odd-cycle situation, i.e., such an increase in spacing will not break the odd-cycle loop in the SADP process. Rather, in the SADP process, the spacing between the two adjacent features must be increased by a sufficient magnitude such that the two adjacent features are spaced so far apart that they may be formed using either the mandrel mask or the block mask—i.e., the spacing must be increased to such an extent that the features are said to be "color insensitive." As before, increasing the spacing between adjacent features has the negative effect of increasing the area or "plot space" of silicon needed to fabricate the circuit, and increasing such spacing may have a "ripple" effect, causing additional odd-cycles that will need to be resolved by increasing the spacing between additional features.

The present disclosure is directed to various methods of generating circuit layouts that are to be formed using self-aligned double patterning (SADP) techniques which may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of generating circuit layouts that are to be formed using self-aligned double patterning (SADP) techniques. In one embodiment, a method is disclosed herein that is directed to the design and manufacture of reticles that may be employed in semiconductor manufacturing. Such a method involves, among other things, creating an overall pattern layout for an integrated circuit that is to be manufactured using a self-aligned double patterning (SADP) process, identifying a plurality of features within the overall pattern layout that cannot be decomposed using the SADP process, wherein at least first and second adjacent features are required to be same-color features, decreasing a spacing between the first and second adjacent features such that the first feature and the second feature become different-color features so as to thereby render the plurality of features decomposable using the SADP process, decomposing the overall pattern layout with the different-color first and second features having the decreased spacing therebetween into a mandrel mask pattern and a block mask pattern, generating a first set of mask data corresponding to the mandrel mask pattern and generating a second set of mask data corresponding to the block mask pattern.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is generally directed to various methods of decomposing circuit layouts that are to be formed using self-aligned double patterning (SADP) techniques. As will be readily apparent to those skilled in the art upon a complete reading of the present application, the methods and devices disclosed herein may be employed in the fabrication of a variety of devices, such as logic devices, memory devices, ASICs, etc. With reference to the attached figures, various illustrative embodiments of the methods, devices and systems disclosed herein will now be described in more detail.

FIG. 2A-2J will be referenced to discuss various aspects of the inventions disclosed herein. Reference will also be made to certain aspects of the prior art process flow described in FIGS. 1A-1M as needed. As indicated in the background section of this application, in an SADP process, the features that are formed, e.g., metal lines, are either mandrel-metal features (MM) or non-mandrel-metal (NMM) features. As it relates to terminology used herein and in the attached claims, the MM features and NMM feature are referred to as being different "colors" when it comes to decomposing an overall pattern layout that is to be manufactured using an SADP process technique. Thus, two MM features are said to be of the "same color," while an MM feature and an NMM feature are said to be of "different colors." Similarly, two NMM features are said to be of the "same color."

Figure 2A:
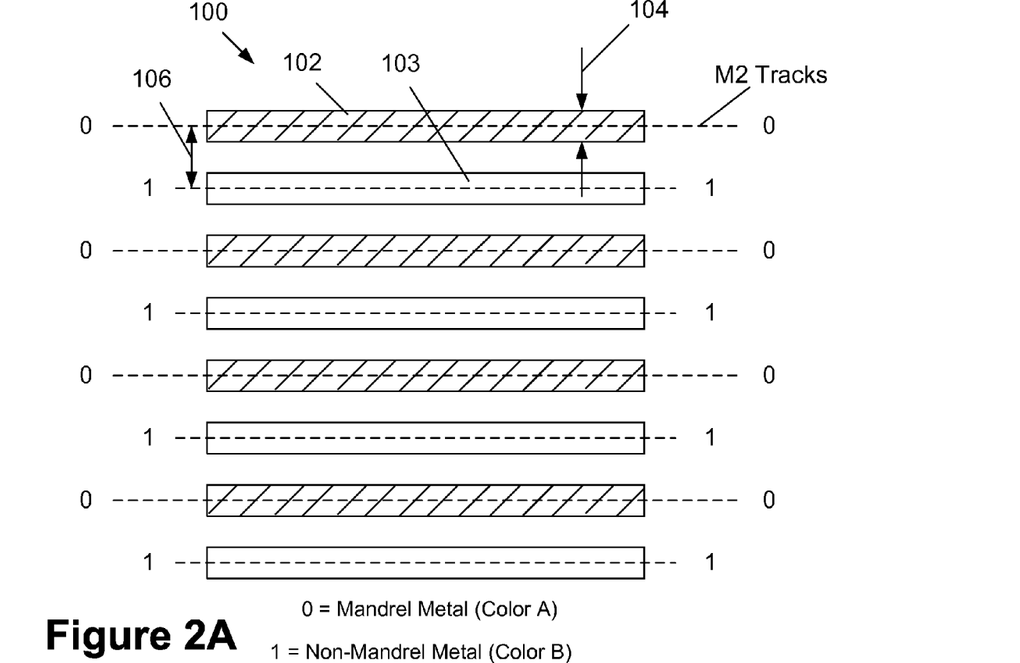
FIGS. 2A-2J depict various illustrative embodiments of various methods disclosed herein of decomposing circuit layouts that are to be formed using self-aligned double patterning (SADP) techniques.

FIG. 2A depicts a simplistic example of a circuit layout, e.g., a plurality of metal lines 100 that are to be formed using an SADP process. The metal lines 100 may be representative of metal lines that are to be formed in the metal-2 (M2) layer of an integrated circuit product. The metal lines 100 are arranged on various tracks ("M2 tracks"), as depicted in dashed lines in FIG. 2A. As it relates to the SADP process, the metal lines 100 may be divided into mandrel-metal lines 102 and non-mandrel-metal lines 103. In the depicted example, the mandrel-metal lines 102 are arranged on the M2 tracks with the "0" designation, while the non-mandrel-metal lines 103 are arranged on the M2 tracks with the "1" designation. In the depicted example, each of the metal lines 100 has a critical dimension or width 104 and they have a pitch 106. The magnitude of the width 104 and the pitch 106 may vary depending upon the particular application, and these dimensions will likely decrease as device dimensions continue to shrink as technology advances. In one example, the metal lines 100 may have a target width 104 of 24 nm and a target pitch 106 of 48 nm. However, as will be appreciated by those skilled in the art after a complete reading of the present application, the various inventions disclosed herein have broad applicability and they may be employed when manufacturing features having any desired configuration, pitch or width. Thus, the present inventions should not be considered to be limited to any of the illustrative numerical examples referenced herein, as those examples are only provided so as to facilitate an understanding of the presently disclosed inventions.

Figure 2B:
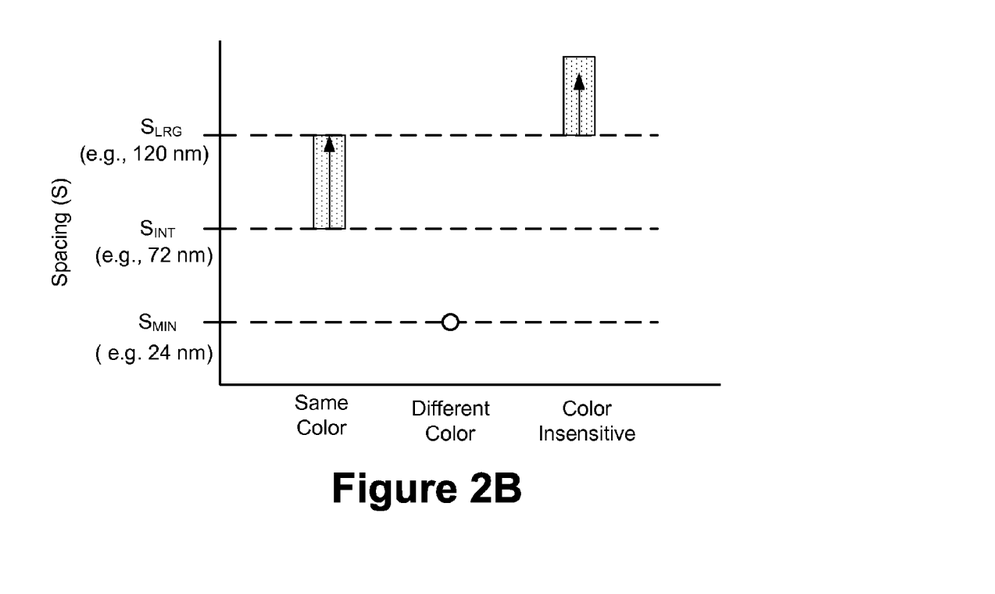

With reference to FIG. 2B, various other aspects of an SADP process will now be discussed. In general, in an SADP process, the minimum width or critical dimension of a mandrel-metal feature is equal to the minimum width 16W of the mandrel 16A (see FIGS. 1B and 1K). On the other hand, the minimum width or critical dimension of a non-mandrel-metal feature is equal to the spacing between two mandrels 16A less twice the spacer width 18W. See FIGS. 1B and 1E. (See dimension 19 in FIG. 1K.) FIG. 2B graphically depicts various "coloring rules" for an SADP process wherein the minimum width 16W of the mandrels 16A is 24 nm, the minimum width 18W of the spacers is 24 nm and the pitch 18P of the mandrels 16A is 96 nm.

With continuing reference to FIG. 2B, if the spacing between adjacent features is 24 nm ($S_{MIN}$), then those two features must be formed with different colors—where one feature is a mandrel-metal (MM) feature and the other feature is a non-mandrel-metal (NMM) feature. When the spacing between features is greater than or equal to 72 nm ($S_{INT}$), then those features may be formed using the same color mask. If the spacing between the adjacent features is greater than 120 nm ($S_{LRG}$), then the features are insensitive to "color" and may be formed using any mask. Note that, in the case where the adjacent features are spaced apart by a distance equal to 72 nm and up to but not including 120 nm, then those features must be formed using the same color mask, i.e., both features are MM features or both features are NMM features. That is, for the condition where $S_{INT} \leq S < S_{LRG}$, then the adjacent features must be formed using the same color mask.

Figure 2C:
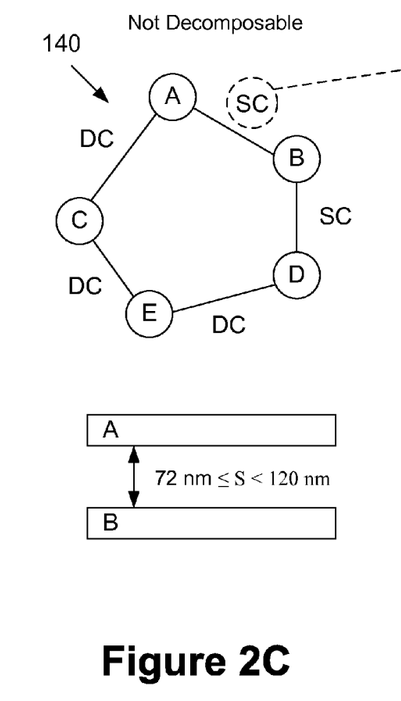

FIG. 2C depicts an example of a polygon loop 140 drawn for five (A-E) adjacent features that are part of a circuit pattern that is to be manufactured using an SADP process. The polygon loop 140 is comprised of five edges. In this example, due to the relative spacing between adjacent features A-C-E and D, those four adjacent features have to be formed using "different color" ("DC") masks. Thus, the polygon loop 140 has three "DC" edges connecting those four features. The spacing between the feature B and its adjacent features A and D is such that the features A and B must be formed using the "same color" ("SC") mask and the features B and C must be formed using the same color mask. In one particular example, the features A and B in the polygon loop 140 may be spaced apart by a distance equal to 72 nm and up to but not including 120 nm, e.g., the condition where $S_{INT} \leq S < S_{LRG}$. Thus, the polygon loop 140 represents an odd-cycle layout due to the odd number of DC edges (three total) in the polygon loop 140. Accordingly, due to the odd number of DC edges in the polygon loop 140, the pattern reflected by the polygon loop 140 is not decomposable and therefore cannot be manufactured using SADP techniques.

Figure 2D:
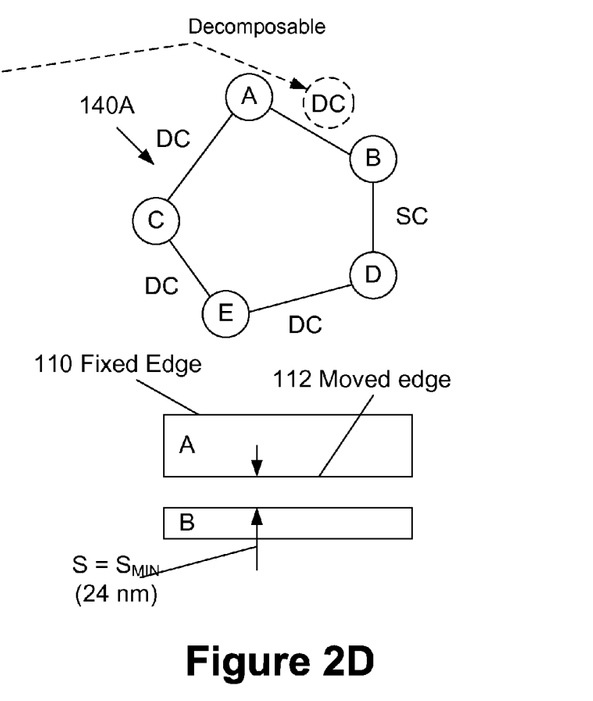

FIG. 2D depicts one aspect of the presently disclosed inventions wherein the pattern represented by the non-decomposable polygon 140 in FIG. 2C may be changed to a decomposable pattern 140A using double patterning techniques. More specifically, in one embodiment disclosed herein, the spacing between adjacent features (e.g., A-B) that had to be formed using the same color mask is decreased so as to force the features (with the decreased spacing therebetween) to be formed using different color (DC) masks. For example, the spacing between the features A and B may be decreased to $S_{MIN}$, e.g., 24 nm, in the example discussed herein, to thereby force the features A and B to be formed using different color masks and thus change an odd cycle loop (3 DC edges) into an even cycle loop (4 DC edges). Effecting such a change in spacing may be accomplished using several techniques. In the example depicted in FIG. 2D, the decrease in spacing between the features A and B may be accomplished by treating one edge 110 of the feature A as being fixed and moving another edge 112 of the feature A toward the feature B. In this example, the position of the edges of the feature B remain unchanged and only feature A is modified. Stated another way, the size of the feature A is increased while the size of the feature B remains unchanged.

Importantly, using the methods disclosed herein, an otherwise non-decomposable pattern may be converted to a decomposable pattern without affecting the spacing relationship between other adjacent features or any area penalty.

Figure 2E:
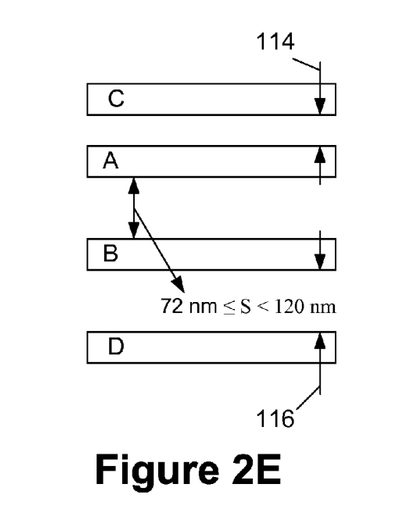
Figure 2F:
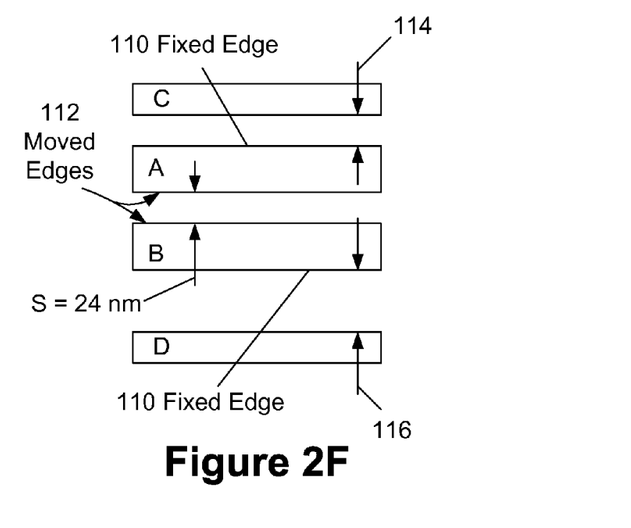

FIGS. 2E and 2F are side by side layouts of a portion of a non-decomposable circuit pattern (FIG. 2E) and a decomposable circuit pattern (FIG. 2F) that will be referenced to explain this point. In FIGS. 2E and 2F, the spacing 114 between the features C and A, as well as the spacing 116 between the features B and D remain unchanged. However, using the methods disclosed herein, the spacing between the features A and B was decreased to $S_{MIN}$, e.g., 24 nm (compare FIGS. 2E and 2F), to thereby force the features A and B to be formed using different masks. In the particular example depicted in FIG. 2F, the decrease in spacing between the features A and B was accomplished by changing the size of both of the features A and B. More specifically, one edge 110 of both of the features A and B was treated as being fixed, while the facing edges 112 of the features A and B were moved toward one another. In this example, the position of the edges of both of the features A and B were modified. Stated another way, the size of both of the features A and B were increased to reduce the spacing between the features A and B.

Figure 2G:
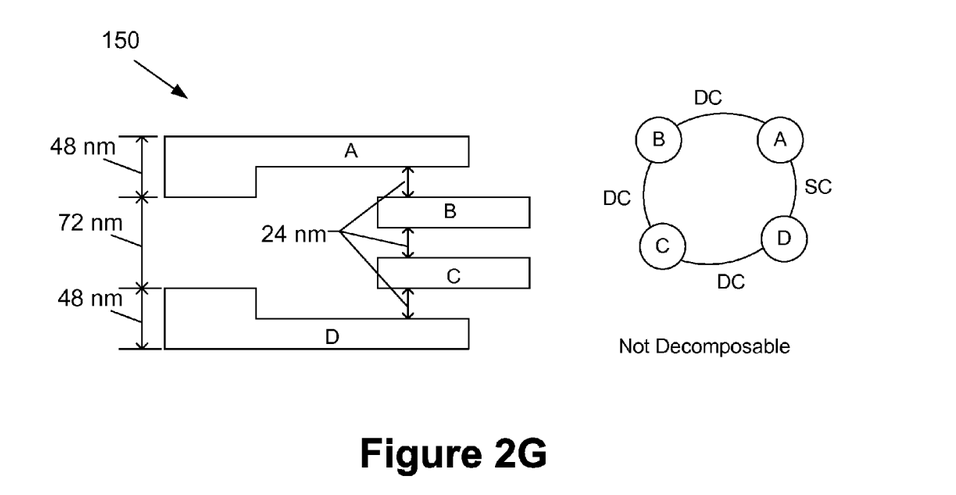
Figure 2H:
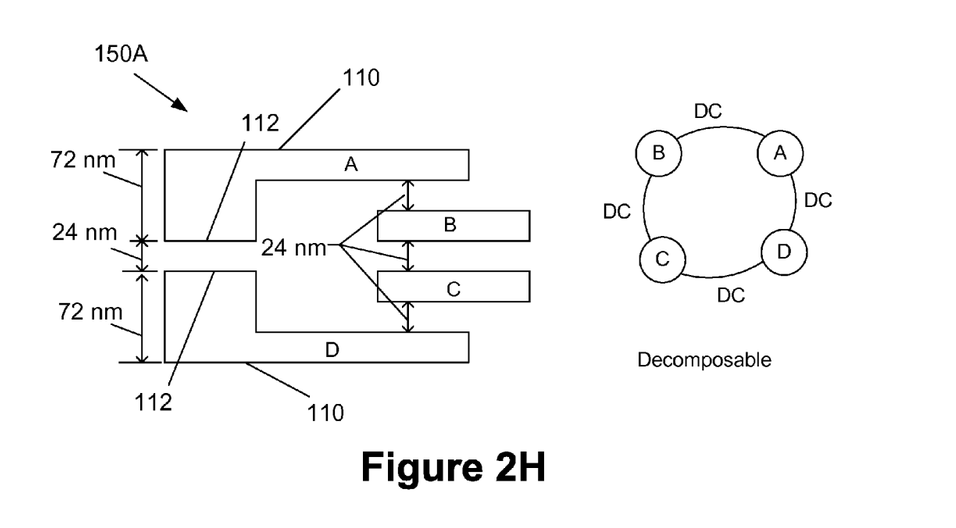

FIGS. 2G-2H provide another example of a pattern layout that may be transformed from a non-decomposable layout to a decomposable layout using the methods disclosed herein. Again, the numbers set forth herein are for purposes of illustration only. In the pattern 150 shown in FIG. 2G, there are four (A-D) adjacent features that are part of a circuit pattern that is to be manufactured using an SADP process. The polygon loop is comprised of four edges. In this example, due to the relative spacing between adjacent features A-B, B-C and C-D, those three features have to be formed using "different color" ("DC") masks. Thus, the polygon loop has three "DC" edges connecting those four features. The spacing (72 nm) between the feature D and its adjacent feature A is such that the features A and D must be formed using the "same color" ("SC") mask. Thus, the pattern 150 represents an odd-cycle layout due to the odd number of DC edges (three total) in the polygon loop. Accordingly, the pattern 150 is not decomposable and therefore cannot be manufactured using SADP techniques.

FIG. 2H depicts an example wherein the size of both of the features A and D are increased to resolve the coloring conflict by forcing the features A and D to be formed using different color (DC) masks. More specifically, in this example, the outside edges 110 of both of the features A and D were treated as being fixed, while portions of the facing edges 112 of both of the features A and D were moved toward one another until the spacing was decreased to 24 nm. Having made this spacing change, the pattern 150A is now decomposable since the polygon has four DC edges.

Figure 2I:
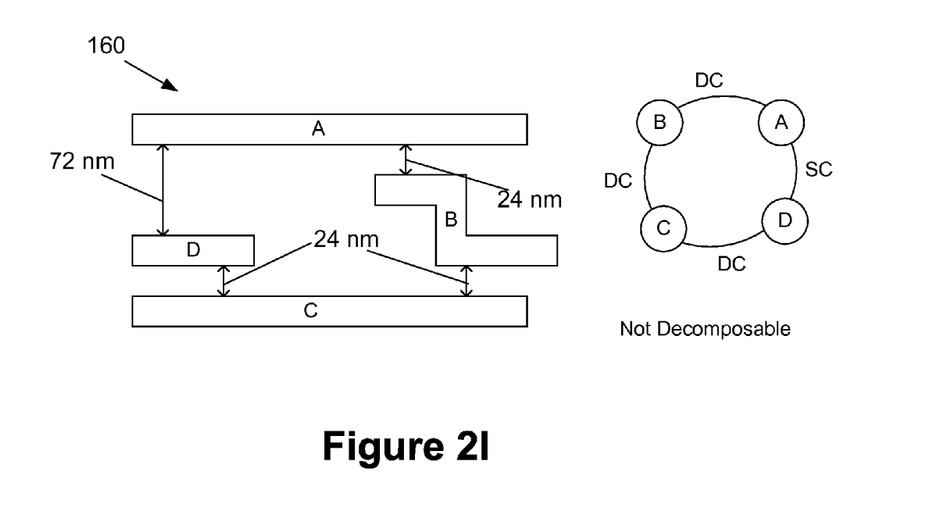
Figure 2J:
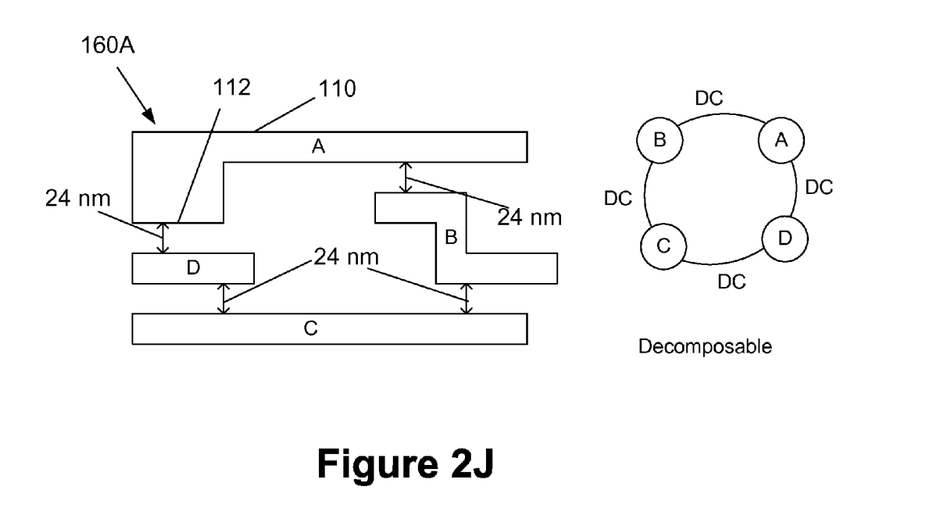

FIGS. 2I-2J provide yet another example of a pattern layout that may be transformed from a non-decomposable layout to a decomposable layout using the methods disclosed herein. Again, the numbers set forth herein are for purposes of illustration only. In the pattern 160 shown in FIG. 2I, there are four (A-D) adjacent features that are part of a circuit pattern that is to be manufactured using an SADP process. The polygon loop is comprised of four edges. In this example, due to the relative spacing between adjacent features A-B, B-C and C-D, those three features have to be formed using "different color" ("DC") masks. Thus, the polygon loop has three "DC" edges connecting those four features. The spacing (72 nm) between the feature D and its adjacent feature A is such that the features A and D must be formed using the "same color" ("SC") mask. Thus, the pattern 160 represents an odd-cycle layout due to the odd number of DC edges (three total) in the polygon loop. Accordingly, the pattern 160 is not decomposable and therefore cannot be manufactured using SADP techniques.

FIG. 2J depicts an example wherein the size of only the feature A is increased to resolve the coloring conflict by forcing the features A and D to be formed using different color (DC) masks. More specifically, in this example, the outside edge 110 of the feature A was treated as being fixed, while a portion of the inside edge 112 of the feature A was moved toward the feature D until the spacing was decreased to 24 nm. During this process, the size of the feature D remained unchanged. Having made this spacing change, the pattern 160A is now decomposable since the polygon has four DC edges.

The techniques disclosed herein are in stark contrast to the methods employed in the prior art SADP processes. More specifically, in the context of attempting to resolve coloring conflicts for patterns to be manufactured using SADP techniques, the prior art methods always involved increasing spacing between adjacent features to resolve such conflicts. Such actions tended to consume additional plot space and cause additional coloring conflicts as the increase in spacing between the adjacent features tended to have a "ripple effect" in other parts of the layout with respect to other features. In contrast, the methods disclosed herein involve decreasing the spacing between adjacent features so as to force those features to be formed using different color masks to resolve odd-cycle conflicts when using an SADP process to manufacture an integrated circuit product. Thus, in contrast to the prior art techniques, using the methods disclosed herein, there may be less plot space consumed when resolving coloring conflicts and changes made to resolve such conflicts may not have adverse "rippling" effects on other parts of the circuit layout.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   receiving an overall pattern layout for an integrated circuit that is to be manufactured using a self-aligned double patterning process (SADP);
   identifying, in a computing device, a plurality of features within said overall pattern layout that cannot be decomposed using said SADP process, wherein at least a first feature and a second feature, which are adjacent features, are required to be same-color features;
   decreasing a spacing between said first feature and said second feature which are adjacent to each other in said computing device such that said first feature and said second feature become different-color features so as to render said plurality of features decomposable using said SADP process;
   decomposing said overall pattern layout with said first feature and said second feature being different-color features and having said decreased spacing therebetween into a mandrel mask pattern and a block mask pattern in said computing device;
   generating a first set of mask data corresponding to said mandrel mask pattern in said computing device; and
   generating a second set of mask data corresponding to said block mask pattern in said computing device.

2. The method of claim 1, further comprising providing said first set of mask data and said second set of mask data to a mask manufacturer.

3. The method of claim 1, wherein said decreasing a spacing between said first feature and said second feature which are adjacent to each other comprises treating a first edge of said first feature as being fixed and moving a second edge of said first feature toward said second feature so as to decrease said spacing between said first feature and said second feature.

4. The method of claim 3, wherein, when decreasing said spacing between said first feature and said second feature, all edges of said second feature are treated as being fixed.

5. The method of claim 1, wherein said decreasing a spacing between said first feature and said second feature which are adjacent to each other comprises treating a first edge of each of said first feature and said second feature as being fixed and moving a second edge of each of said first feature and said second feature towards each other so as to decrease said spacing between said first feature and said second feature.

6. The method of claim 1, wherein said decreasing a spacing between said first feature and said second feature which are adjacent to each other comprises increasing a size of only one of said first feature and said second feature while keeping a size of the other of said first feature and said second feature unchanged so as to decrease said spacing between said first feature and said second feature.

7. The method of claim 1, wherein said decreasing a spacing between said first feature and said second feature which are adjacent to each other comprises increasing a size of both of said first feature and said second feature so as to decrease said spacing between said first feature and said second feature.

8. The method of claim 1, wherein said first feature and said second feature, which are same-color features, are both mandrel-metal (MM) features.

9. The method of claim 1, wherein said first feature and said second feature, which are same-color features, are both non-mandrel-metal (NMM) features.

10. The method of claim 1, wherein one of said first feature and said second feature, which are different-color features, is a mandrel-metal (MM) feature and the other of said different-color first and second features is a non-mandrel-metal (NMM) feature.

11. The method of claim 1, further comprising manufacturing integrated circuit products using masks fabricated based upon said first set of mask data and said second set of mask data.

12. A method, comprising:
   receiving an overall pattern layout for an integrated circuit that is to be manufactured using a self-aligned double patterning process (SADP) in a computing device;
   identifying a plurality of features within said overall pattern layout that cannot be decomposed using said SADP process in said computing device, wherein at least a first feature and a second feature, which are adjacent features, in said plurality of features are required to be same-color features;
   decreasing a spacing between said first feature and said second feature which are adjacent to each other in said computing device such that said first feature and said second feature become different-color features so as to render said plurality of features decomposable using said SADP process, wherein said decreasing a spacing between said first feature and said second feature which are adjacent to each other comprises increasing a size of only one of said first feature and said second feature while keeping a size of the other one of said first feature and said second feature unchanged;

decomposing said overall pattern layout with said first feature and said second feature being different-color features and having said decreased spacing therebetween into a mandrel mask pattern and a block mask pattern in said computing device;

generating a first set of mask data corresponding to said mandrel mask pattern in said computing device; and generating a second set of mask data corresponding to said block mask pattern in said computing device.

13. The method of claim 12, further comprising providing said first set of mask data and said second set of mask data to a mask manufacturer.

14. The method of claim 12, further comprising manufacturing integrated circuit products using masks fabricated based upon said first set of mask data and said second set of mask data.

15. The method of claim 12, wherein said decreasing a spacing between said first feature and said second feature which are adjacent to each other comprises treating a first edge of said first feature as being fixed and moving a second edge of said first feature toward said second feature so as to decrease said spacing between said first feature and said second feature while all edges of said second feature are treated as being fixed.

16. A method, comprising:

receiving an overall pattern layout for an integrated circuit that is to be manufactured using a self-aligned double patterning process (SADP) in a computing device;

identifying a plurality of features within said overall pattern layout that cannot be decomposed using said SADP process in said computing device, wherein at least a first feature and a second feature, which are adjacent features, in said plurality of features are required to be same-color features;

decreasing a spacing between said first feature and said second feature which are adjacent to each other in said computing device such that said first feature and said second feature become different-color features so as to render said plurality of features decomposable using said SADP process, wherein said decreasing a spacing between said first feature and said second feature which are adjacent to each other comprises increasing a size of both of said first feature and said second feature so as to decrease said spacing between said first feature and said second feature;

decomposing said overall pattern layout with said first feature and said second feature being different-color features and having said decreased spacing therebetween into a mandrel mask pattern and a block mask pattern in said computing device;

generating a first set of mask data corresponding to said mandrel mask pattern in said computing device; and generating a second set of mask data corresponding to said block mask pattern in said computing device.

17. The method of claim 16, further comprising providing said first set of mask data and said second set of mask data to a mask manufacturer.

18. The method of claim 16, further comprising manufacturing integrated circuit products using masks fabricated based upon said first set of mask data and said second set of mask data.

19. The method of claim 16, wherein said decreasing a spacing between said first feature and said second feature which are adjacent to each other comprises treating a first edge of each of said first feature and said second feature as being fixed and moving a second edge of each of said first feature and said second feature towards each other so as to decrease said spacing between said first feature and said second feature.

\* \* \* \* \*